United States Patent
Moriizumi et al.

(12) 
(10) Patent No.: US 6,485,814 B1
(45) Date of Patent: Nov. 26, 2002

(54) HIGH DENSITY THIN FILM CIRCUIT BOARD AND METHOD OF PRODUCTION THEREOF

(75) Inventors: Kiyokazu Moriizumi, Kawasaki (JP); Mikio Nishihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/513,162

(22) Filed: Feb. 25, 2000

(30) Foreign Application Priority Data

Apr. 5, 1999 (JP) .......................... 11-097606

(51) Int. Cl.$^7$ ................................ B32B 3/00
(52) U.S. Cl. ................. 428/210; 174/263; 174/264; 257/773; 257/774; 257/779; 257/780; 257/786
(58) Field of Search .................... 428/210; 174/262, 174/263, 264; 257/773, 774, 779, 780, 786

(56) References Cited

U.S. PATENT DOCUMENTS

| | | | | |
|---|---|---|---|---|
| 5,329,423 A | * | 7/1994 | Scholz | ........................ 361/760 |
| 5,340,947 A | * | 8/1994 | Credle et al. | ................. 174/262 |
| 5,661,267 A | * | 8/1997 | Isaak | ........................... 174/264 |
| 6,087,597 A | * | 7/2000 | Shimada et al. | ............. 174/263 |
| 6,091,027 A | * | 7/2000 | Hesselbom et al. | ......... 174/255 |

FOREIGN PATENT DOCUMENTS

JP 09018144 1/1997

* cited by examiner

*Primary Examiner*—Cathy Lam
(74) *Attorney, Agent, or Firm*—Armstrong, Westerman & Hattori, LLP

(57) ABSTRACT

To provide electrical conduction between front and back surfaces of a thin film multi-layered circuit board, such as an MCM, at low cost without using a simultaneous firing process for ceramic. The thin film multi-layered circuit board has at least one thin film circuit layer on a first surface of a substrate, wherein a conductor layer is disposed in the lowermost layer of the thin film circuit layer in contact with the first surface of the substrate, and is characterized in that holes for providing the electrical conduction between front and back surfaces of the substrate are formed through the substrate from the first surface to a second surface thereof so that the conductor layer is exposed in the hole, wherein the diameter of the hole is gradually enlarged from the first surface to the second surface.

9 Claims, 9 Drawing Sheets

HIGH DENSITY THIN FILM CIRCUIT BOARD AND METHOD OF PRODUCTION THEREOF

BACKGROUND OF THE INVENTION

1. Field of the Invention

The present invention relates to a structure of a high density multi-layered thin film circuit board for mounting electronic elements thereon, such as large scale integrated circuits (LSI) or input/output pins, particularly to a structure for obtaining an electrical conduction between front and back surfaces of such a multi-layered thin film circuit board.

2. Description of the Related Art

Recently, a thin film circuit board capable of providing high density circuits, a so-called MCM (multi-chip module) substrate, and applicable to an electronic equipment such as a computer, has been put into practical use. In the circuit board, the formation of an extremely thin dielectric layer of polyimide has become possible by means of a spin coating method.

In this case, since signal patterns are also formable by a sputtering method and an etching method using a high-density resist, it is possible to realize high density patterns more dense than those of an ordinary printed circuit board.

In the prior art, an MCM called an MCM-D/C (D is an abridgment of "deposit" and C is that of "co-firing") has been developed, and put into practice, wherein thin film circuits are formed in a multi-layered manner on a ceramic substrate and thick film circuits are formed in the interior thereof. This is because it enables a number of terminals to be mounted thereon and a wire length necessary therefor to be shortened by mounting functional elements such as an LSI or the like on one surface and input/output terminals on the other surface, resulting in a significant advantage in the performance thereof.

In this regard, as a prior art, Japanese Unexamined Patent Publication No. 9-18144 discloses a multi-layered circuit board of glass ceramic wherein connector electrodes, capable of carrying input/output terminals on a glass ceramic member with sufficient strength and reliability, are provided on a back surface of the glass ceramic multi-layered circuit board. This circuit board has conductors of copper or copper alloy at least in the interior thereof used as connector terminals for arranging input/output terminals on the back surface and thick film pads of copper or copper alloy embedded in a back surface and connected to the conductors.

The thick film ceramic substrate formed by the co-firing method, however, has drawbacks of high production cost, which is particularly true of that having no signal circuits in the respective layer but only having vias bored between front and back surfaces thereof. Accordingly, a substrate is required which has a structure low in production cost and capable of achieving a desired function.

SUMMARY OF THE INVENTION

Accordingly, an object of the present invention is to provide a high density thin film circuit board and a process for producing the same, which board is capable of providing electrical conduction between front and back surfaces of the multi-layered thin film circuit board such as an MCM or the like at a low cost.

To achieve the above-mentioned object, according to the present invention, a high density thin film circuit board is provided, having at least one thin film circuit layer on a first surface of a substrate, wherein a conductor layer is disposed in the lowermost layer of the thin film circuit layer in contact with the first surface of the substrate, characterized in that holes for providing electrical conduction between front and back surfaces of the substrate are formed through the substrate from the first surface to a second surface thereof so that the conductor layer is exposed in the hole, wherein the diameter of the hole is gradually enlarged from the first surface to the second surface.

Advantageously, a solder bump to be in contact with the conductor layer is formed in the interior of the hole. In this case, the inner surface of the hole is preferably provided with an Ni-plated layer for preventing the solder from diffusing and an Au-plated layer for improving the wettability to solder.

Favorably, a metallic input/output pad is formed on the inner surface of the hole. In this case, a solder bump is preferably formed on the input/output pad. Also, an input/output pin is favorably mounted onto the input/output pad.

Advantageously, etchable glass, metal or Si wafer is used as the substrate.

Further, according to the present invention, a process for producing a high density thin film circuit board is provided, having at least one thin film circuit layer on a first surface of a substrate, wherein a conductor layer is disposed in the lowermost layer of the thin film circuit layer in contact with the first surface of the substrate, characterized in that the process comprises the steps of: forming the at least one thin film circuit layer on the first surface of the substrate, and etching the substrate from a second surface thereof to form a hole so that the conductor layer is exposed in the hole.

Preferably, the process further comprises a step for forming a solder bump by adhering solder to a metallic surface of the conductor layer exposed in the bottom of the hole and heating the solder until it is melted. In this case, the solder may be supplied to the interior of the hole by a printing, or the solder may be supplied to the interior of the hole as a solder ball.

Preferably, prior to supplying the solder, Ni/Au-plated layers may be formed on the inner surface of the hole for the purpose of an improvement in wettability to solder.

Or, the process may comprise a step of forming a metallic input/output pad on the inner surface of the hole. In this case, the process may further comprise a step for mounting an input/output pin onto the input/output pad.

Favorably, prior to forming the hole by etching, a guide hole is formed in advance, by the use of a laser beam, and is thereafter enlarged by the etching operation to complete the hole.

As described above, according to the present invention, an MCM can be provided which is capable of mounting electronic elements on opposite surfaces of a substrate without using a ceramic substrate having vias for conducting front and back surfaces thereof as in the prior art and which allows more inexpensive materials to be employed for this purpose.

DETAILED DESCRIPTION OF THE EMBODIMENTS

The present invention will be described in more detail with reference to the preferred embodiments illustrated in the attached drawings.

Figure 1:
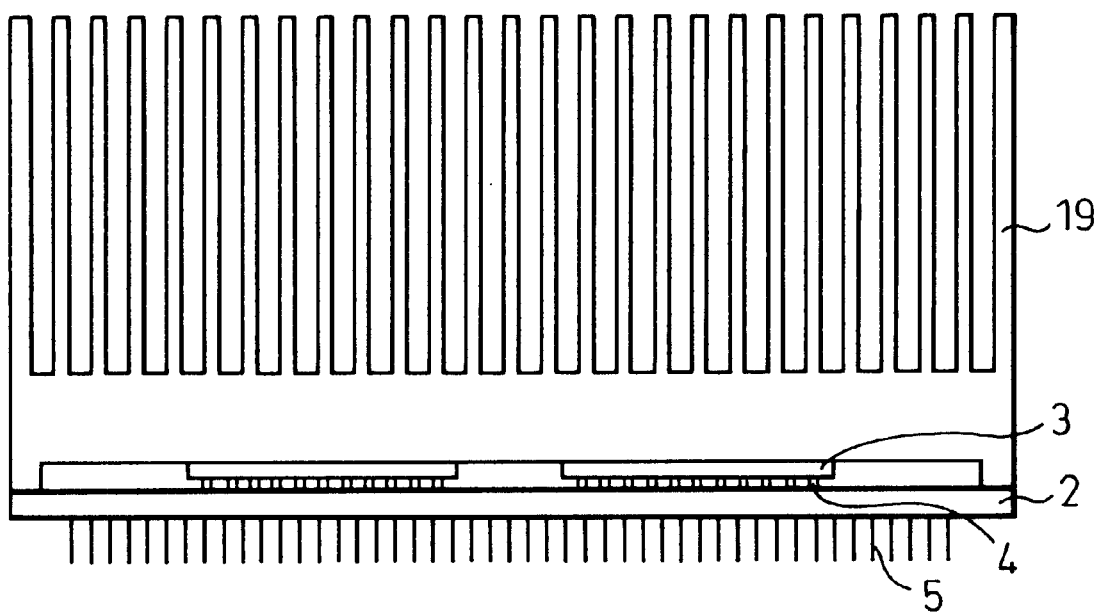
FIG. 1 is a sectional view showing the entirely of a prior art multi-chip module.
Figure 2:
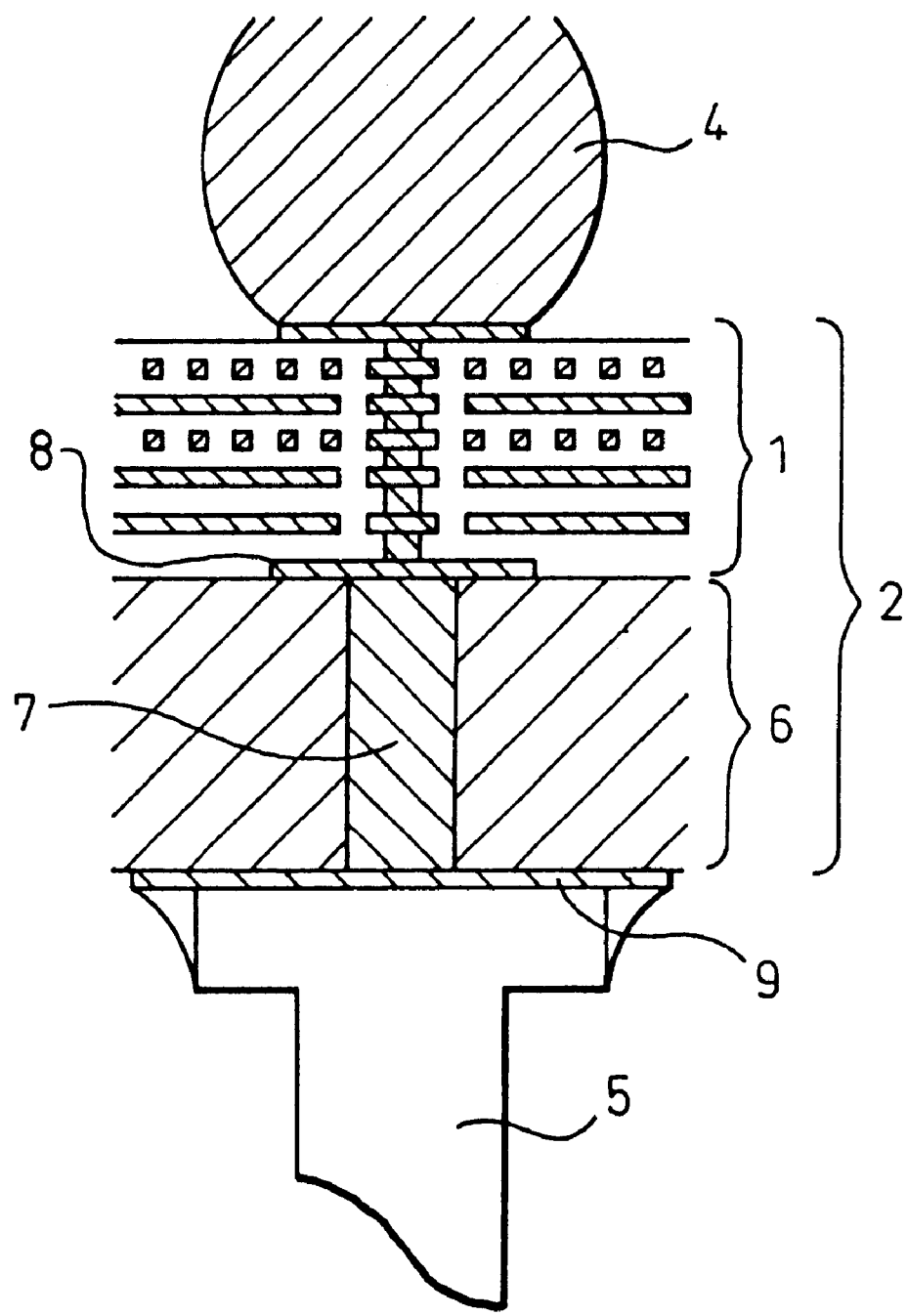
FIG. 2 is a detailed sectional view of a portion of FIG. 1.

First, the explanation will be made on a prior art multi-chip module of a type to which a thin film circuit board according to the present invention is applicable. FIG. 1 is a sectional view showing the entirely of a prior art multi-chip module, and FIG. 2 is a detailed sectional view of a portion of FIG. 1;

As shown in FIGS. 1 and 2, the prior art multi-chip module is structured as follows. A thin film multi-layered circuit 1 is formed on one surface; i.e., the upper surface as seen in the drawings; of a thin film multi-layered circuit board 2. Large scale integrated circuit (LSI) chips 3 are mounted on the thin film multi-layered circuit 1 via solder bumps 4 by means of a flip chip method. A cooling fin 19 is mounted onto a back surface (upper surface) of these chips 3 opposite to the mount surface. According to this structure, it is possible to directly dissipate heat generated in the LSI chips 3 through the cooling fin 19. Input/output pins 5 are provided on a surface opposite to the surface of the thin film multi-layered circuit board 2 carrying the chips 3; i.e., the lower surface as seen in the drawing, for the purpose of signal transmission between the thin film multi-layered circuit 1 or the chips 3 and outside and of power supply to the former.

With reference to the detailed structure shown in FIG. 2, a through-via 7 is provided in a ceramic substrate 6 constituting a substrate of the thin film circuit board 2 for the purpose of electric conduction between front and back surfaces of this substrate, and electrically connects a thin film conductor 8 disposed in the lowermost layer located on the upper surface of the substrate to a pad 9 disposed on the lower surface of the substrate for the connection to the input/output pin. The through-via 7 is formed in the following steps. After a hole has been formed in a ceramic 6 of the base material by a laser, the hole is filled with a metal powder. Otherwise, a green sheet which is a sheet, 0.2 to 0.28 mm thick, formed of a mixture of ceramic powder, glass powder and binder is punched to have holes which then is filled with metallic powder such as molybdenum or tungsten. Some green sheets are superposed and fired together with the ceramic sheet to result in the ceramic substrate. Thus, the through-via 7 is formed simultaneously with the firing of the ceramic substrate. On the upper surface of the ceramic substrate 6 above the vias 7, the thin film circuit 1 is formed. The thin film circuit 1 is formed in a multi-layer manner.

Figure 3:
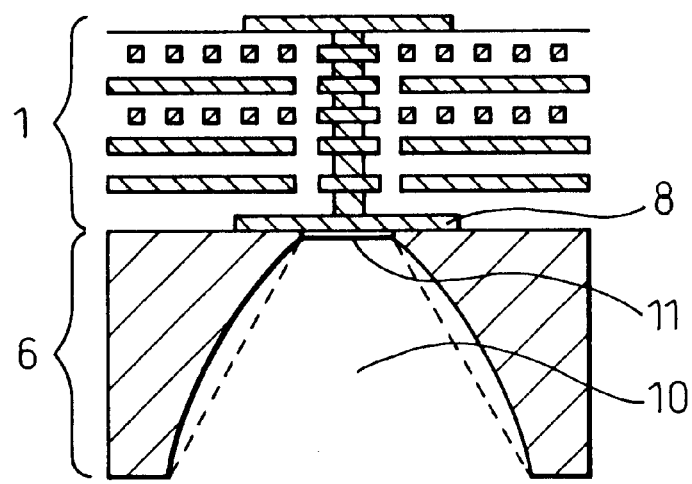
FIG. 3 is a diagrammatic sectional view of a portion of a high density multi-layered thin film circuit board (multi-chip module) according to the present invention.

FIG. 3 shows a diagrammatic view of the present invention, wherein an insulating substrate made, for example, of glass is used instead of the conventional ceramic substrate having through-vias 7 as in FIG. 2. First, a thin film multi-layered circuit 1 is formed on the upper surface of this substrate 6, then a hole 10 is provided in the substrate 6, from the lower surface thereof, toward the conductor 8 in the lowermost layer of the thin film multi-layered circuit so that the conductor 8 is exposed in this hole 10 to allow the front and back surfaces of the substrate 6 to be connected to each other through this hole 10.

The hole 10 may be formed by chemical etching or by initially forming a guide hole with a laser beam and then finishing the same by etching to complete the hole. In any cases, the formation of the hole starts from the back (lower) surface of the substrate 6 so that the diameter of the hole 10 varies in such a manner that it is smaller nearer to the lowermost conductor 8 and larger farther from the lowermost conductor 8 and nearer to the back surface of the substrate to result in a conical or bell shape.

Figure 4:
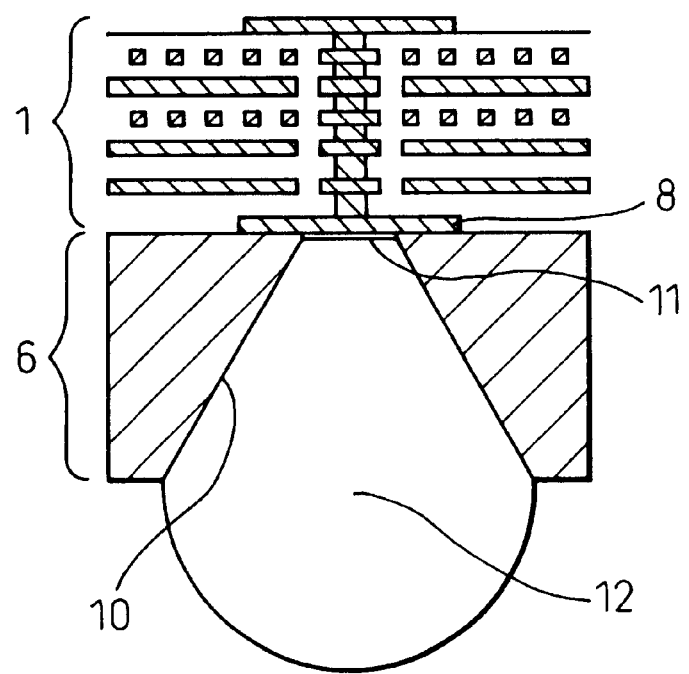
FIGS. 4 to 6 are partially sectional views of the other embodiments of the present invention.

FIG. 4 shows an embodiment wherein, after the hole 10 shown in FIG. 3 has been formed, a solder bump 12 is provided in the hole as an input/output terminal. After the conductor pad 8 in the lowermost layer exposed in the bottom of the hole 10 has been imparted with an Ni-plated layer used as a barrier against the diffusion of solder and an Au-plated layer for improving the wettability to solder, solder paste is imparted into the hole 10 by a printing method and heated at a temperature above the melting point of the solder, whereby the solder is molten to form a solder ball 12. To control an amount of solder when the solder paste is given by the printing method, a screen sheet (not shown) perforated in correspondence to positions of the holes 10 may be employed. Alternatively to the printing method, solder may be supplied as solder balls to the holes 10.

Figure 5:
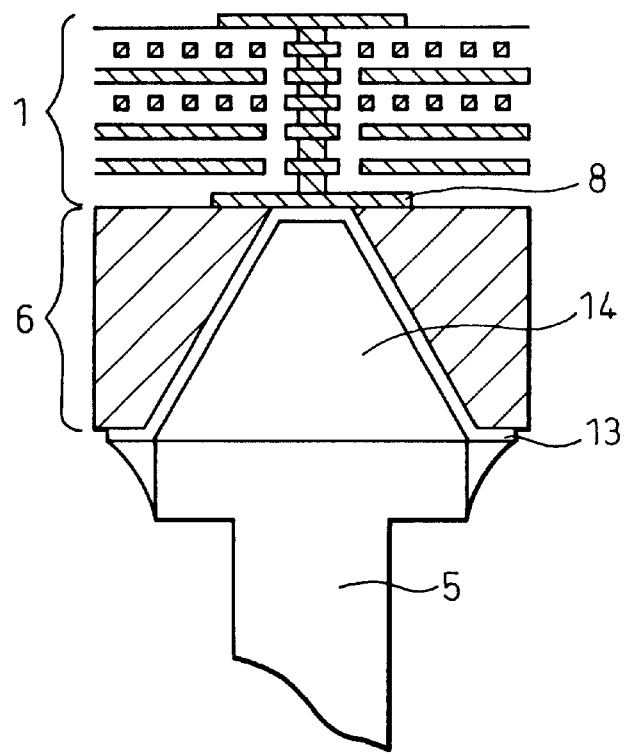

FIG. 5 shows a further embodiment wherein after the hole 10 shown in FIG. 3 has been formed, a pin 5 used as an input/output terminal is mounted in the hole. In this case, a hole 10 is formed by an etching or others from the back surface of the substrate, then a pad 13 for mounting the pin is formed by an Au-plating or others, and the pin 5 is bonded to the pad 13 with a brazing material or solder 14.

Figure 6:
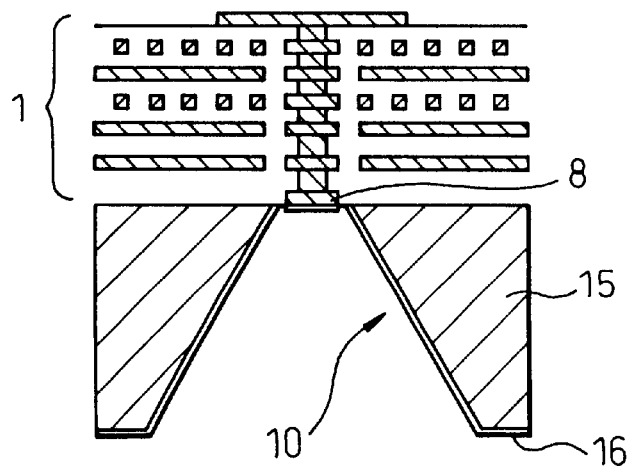

FIG. 6 shows a further embodiment wherein conductive metallic material or Si wafer 15 is used as a substrate. A size of a thin film conductor pad 8 in the lowermost layer of a thin film multi-layered circuit 1 is smaller than an upper surface-side diameter of a hole 10 opened in the substrate 15. It is necessary that the inner surface of the hole 10 and a back surface of the substrate are coated with resin and subjected to surface oxidation to have an insulation layer 16 so that no short circuit occurs between the input/output terminals such as solder bumps or pins described above and the substrate 15 through the substrate 15. In this regard, the process for forming the solder bump 12 and for mounting the pin 5 thereafter is the same as in the preceding embodiments.

Figure 7:
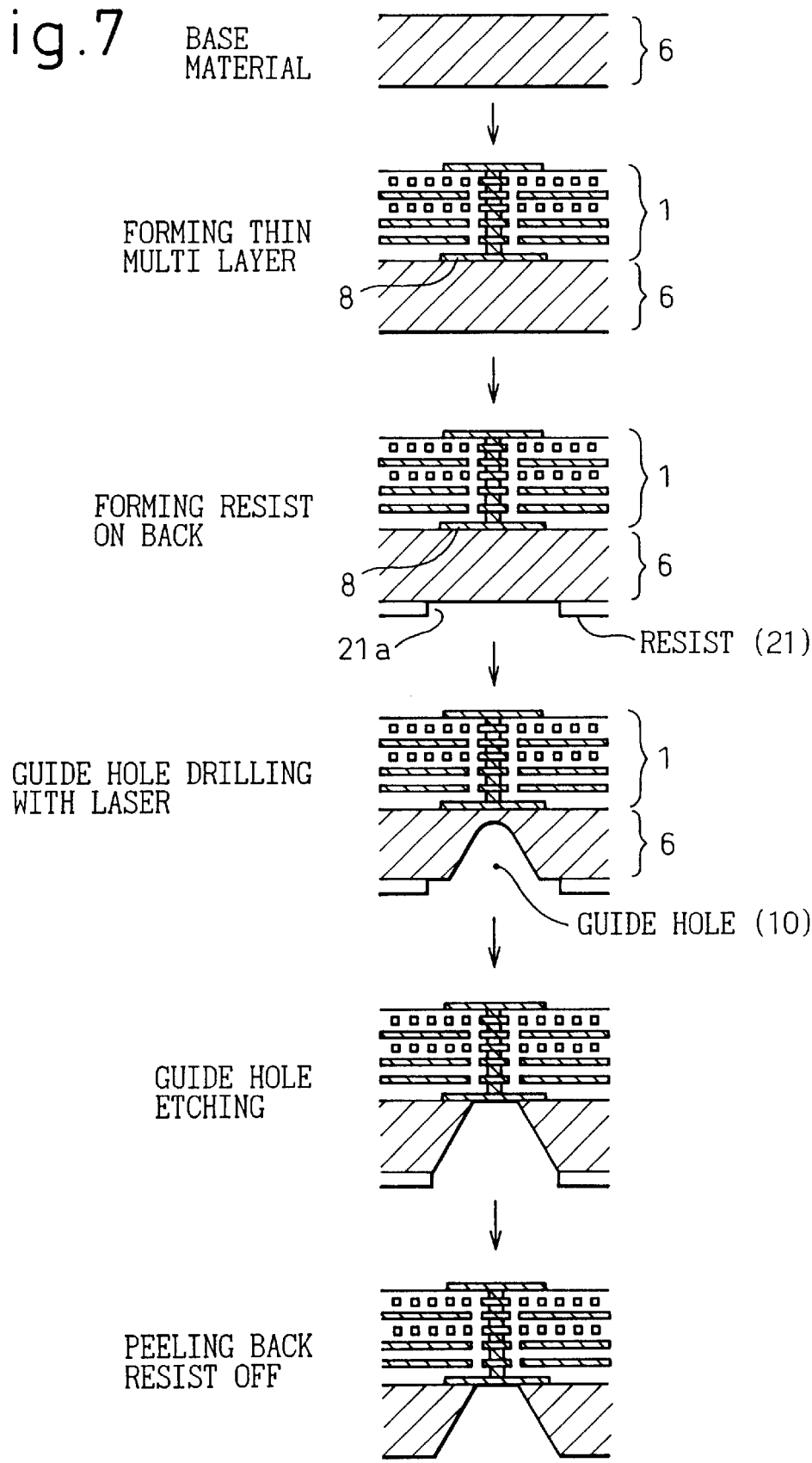
FIGS. 7 and 8 show the first half and a second half, respectively, of a process for producing a high density multi-layered thin film circuit board (multi-chip module) according to the present invention, wherein FIG. 8 also shows the case when a plated layer is formed on the bottom of a hole.

FIG. 7 shows the first half of a process for producing a high density thin film circuit board according to the present invention. First, a quartz type insulating substrate 6 such as glass is prepared. This substrate 6 must be capable of being bored with a fluorine type etching liquid. Then, a thin film multi-layered circuit board 1 is formed on the surface of the insulating substrate 6. In the lowermost layer of the thin film multi-layered circuit 1 is formed a conductor pad 8. Next, a resist film 21 is formed on the back surface of the substrate 6 to provide a masking for the hole formation process. This resist film 21 provides mask openings 21a on the surface of the substrate 6 at positions corresponding to those of the conductor pads 8 in the lowermost layer. A guide hole 10 is prepared by irradiating a laser beam via the mask opening 21a and then finished by using an etching liquid. Finally, the resist film 21 is removed from the back surface of the substrate 6.

Figure 8:
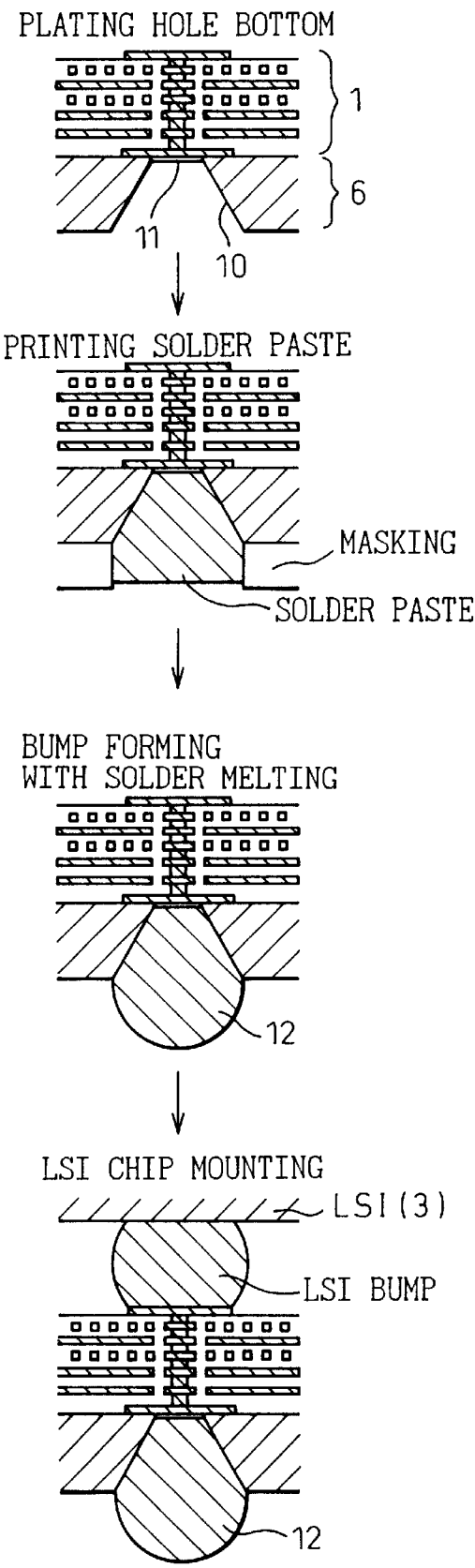

FIG. 8 shows the second half of the process which is a process for forming a solder bump subsequent to that shown in FIG. 7. First, on the bottom of the hole 10, that is, an exposed surface of the conductor pad 8 is applied with an Ni-plated layer providing a barrier against the diffusion of solder and an Au-plated layer for improving the wettability to solder. Next, solder paste is supplied into the holes 10 by a printing method while using a mask 22. Heat is applied to the solder paste to increase the temperature thereof to above a melting point of solder until the same is melted to form a solder ball 12. Subsequently, a semiconductor chip 3 is mounted onto the thin film multi-layered circuit 1. When the chip 3 is mounted, a bump such as a solder ball is formed on the connection pad provided on the upper surface of the thin film multi-layered circuit 1, and a LSI chip 3 is mounted thereon by a flip chip method.

Figure 9:
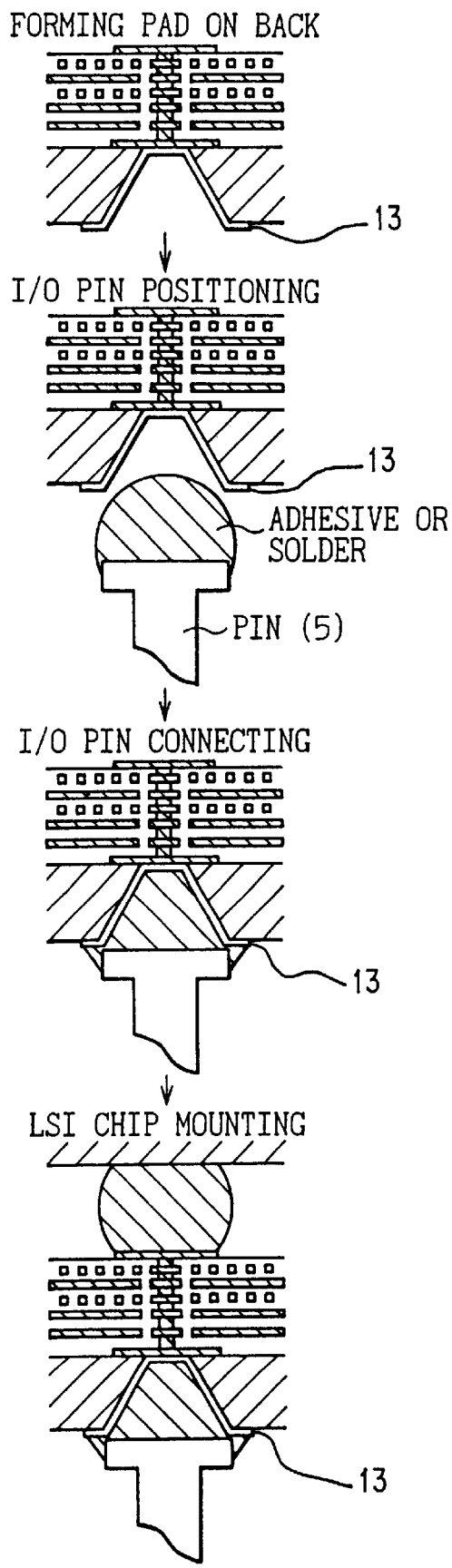
FIG. 9 shows the second half of a process, when a back side pad is formed.

FIG. 9 also shows the second half of the process subsequent to that shown in FIG. 7, wherein a input/output pin 5 is attached in this embodiment. First, a pin-mounting pad 13 is formed on the bottom and the inner surface of a hole 10 by Au plating or the like. Then, the input/output pin 5 is bonded onto the pad 13 with brazing material or solder 14. Thereafter, an LSI chip 3 is mounted by a flip chip method in the same manner as shown in FIG. 8.

Figure 10:
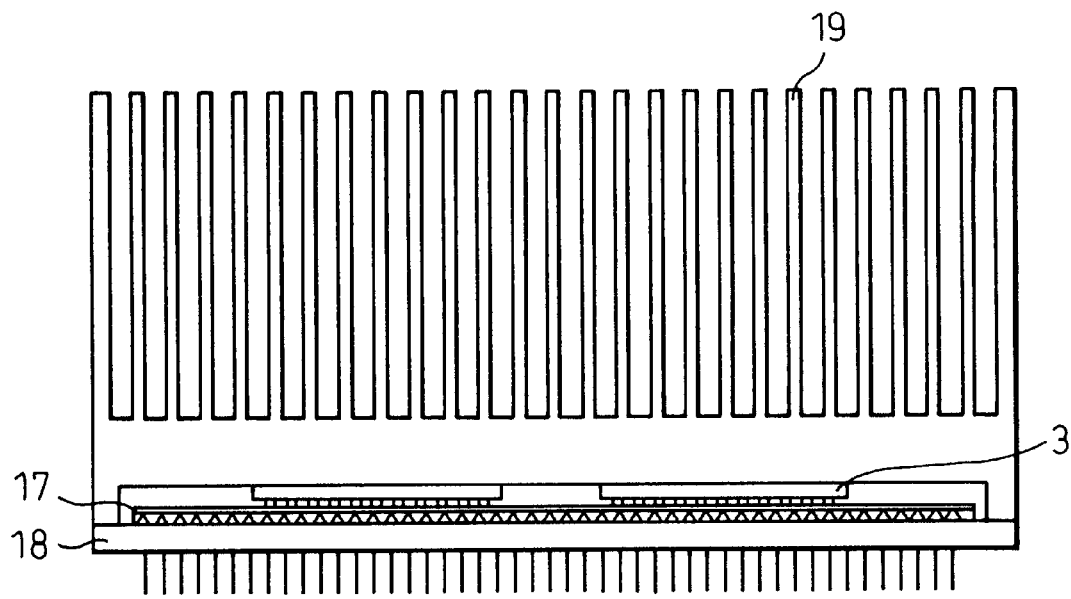
FIG. 10 is a sectional view showing the entirely of a multi-chip module according to another embodiment of the present invention.
Figure 11:
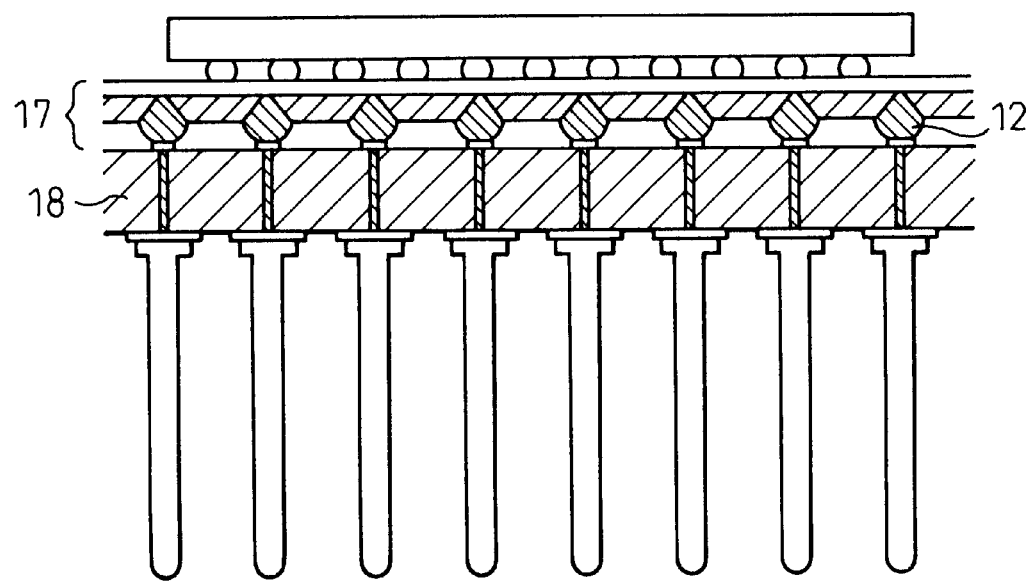
FIG. 11 is a detailed sectional view of a portion of FIG. 10.

FIGS. 10 and 11 illustrate one variation of a multi-chip module based on the embodiment shown in FIG. 4, wherein FIG. 10 is a sectional view showing the entirety of the multi-chip module and FIG. 11 is a detailed sectional view of part of FIG. 10 in an enlarged scale. A thin film multi-layered circuit board 17 having solder bumps 12 formed after holes have been formed in the substrate is mounted via the solder bumps 12 onto a cavity 18 made of alumina or organic material to which are in advance attached input/output pins. LSI chips 3 are mounted on the thin film multi-layered substrate 17, and a cooling fin 19 is attached to the former.

Figure 12:
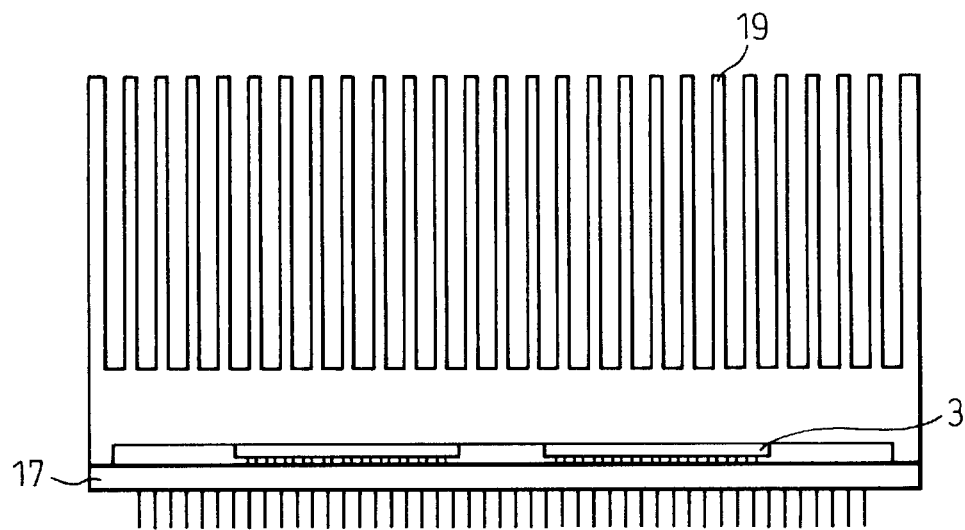
FIG. 12 is a sectional view showing the entirely of a multi-chip module according to a further embodiment of the present invention.
Figure 13:
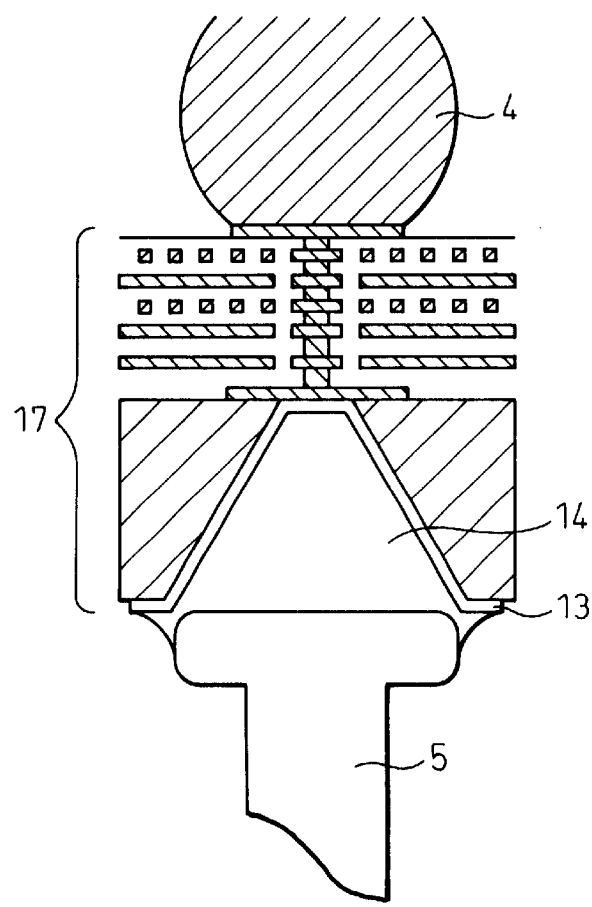
FIG. 13 is a detailed sectional view of a portion of FIG. 12.

FIGS. 12 and 13 illustrate another variation of a multi-chip module based on the embodiment shown in FIG. 5, wherein FIG. 12 is a sectional view showing the entirety of the multi-chip module and FIG. 13 is a detailed sectional view of part of FIG. 12 in an enlarged scale. LSI chips 3 are mounted on a thin film multi-layered circuit board 17 carrying input/output pins 5 on a substrate after holes have been formed in the substrate, and a cooling fin 19 is attached.

The preferred embodiments of the present invention have been described in detail with reference to the attached drawings as mentioned above. It should be noted that the present invention should not be limited to the abovementioned embodiments but can include various aspects, modification and changes without departing from the spirit and the scope of the present invention.

What is claimed is:

1. A high density thin film circuit board, comprising:

a base substrate having a cavity inbetween a first and a second surface correspondingly forming a first surface hole and a second surface hole thereon, said first and second surface holes being provided for electrical conduction between said first and second surfaces, a plurality of diameters of said cavity being gradually enlarged as they are further away from said first surface and further approaching said second surface;

at least one thin film circuit layer formed on said first surface of said substrate; and a conductor layer disposed in a lowermost layer of the at least one thin film circuit layer to be in contact with said first surface of the base substrate, said conductor layer being exposed to said first surface hole;

wherein an inner surface of the hole is provided with one of an Ni-plated layer serving as a barrier against a diffusion of solder and an Au-plated layer for improving the wettability to solder.

2. A circuit board as defined in claim 1, further comprising an electrical connecting means for connection filled in said cavity for electrical conduction between said first and second surfaces.

3. A circuit board as defined in claim 2, wherein said electrical connecting means for connection is a solder bump formed in an interior of said cavity and in contact with said conductor layer.

4. A circuit board as defined in claim 1, wherein a metallic input/output pad is formed on an inner surface of said cavity.

5. A circuit board as defined in claim 4, wherein a solder bump is formed on said input/output pad.

6. A circuit board as defined in claim 4, wherein an input/output pin is mounted onto the input/output pad.

7. A circuit board as defined in claim 1, wherein one of etchable glass, metal and Si wafer is used as said base substrate.

8. A high density thin film circuit board, comprising:

a base substrate having a cavity inbetween a first and a second surface correspondingly forming a first surface hole and a second surface hole thereon, said first and second surface holes being provided for electrical conduction between said first and second surfaces, a plurality of diameters of said cavity being gradually enlarged as they are further away from said first surface and further approaching said second surface;

at least one thin film circuit layer formed on said first surface of said substrate; and a conductor layer disposed in a lowermost layer of the at least one thin film circuit layer to be in contact with said first surface of the base substrate, said conductor layer being exposed to said first surface hole;

wherein one of etchable glass, metal and Si wafer is used as said base substrate.

9. A circuit board as defined in claim 8, wherein an inner surface of the cavity is provided with one of an Ni-plated layer serving as a barrier against a diffusion of solder and an Au-plated layer for improving the wettability solder.

* * * * *